United States Patent [19]

Nagaoka

[11] Patent Number: 5,638,027
[45] Date of Patent: Jun. 10, 1997

[54] INTEGRATED CIRCUIT AMPLIFIER

[75] Inventor: Masami Nagaoka, Ebina, Japan

[73] Assignee: Kabushiki Kaisha Toshiba, Kawasaki, Japan

[21] Appl. No.: 594,835

[22] Filed: Jan. 30, 1996

[30] Foreign Application Priority Data

Jan. 30, 1995 [JP] Japan ................................ 7-012130

[51] Int. Cl.$^6$ .................................................. H03F 3/217
[52] U.S. Cl. .......................... 330/306; 330/307; 330/251
[58] Field of Search .............................. 330/207 A, 251, 330/302, 306, 307

[56] References Cited

U.S. PATENT DOCUMENTS 5,347,229  9/1994  Suckling et al. ................ 330/306 X

OTHER PUBLICATIONS

"High Efficiency Amplication Techniques," *Nikki Electronics*, pp. 121–146, Aug. 23, 1976.

*Primary Examiner*—James B. Mullins
*Attorney, Agent, or Firm*—Foley & Lardner

[57] ABSTRACT

An integrated circuit includes an amplifier for amplifying input electric power having a predetermined frequency determined depending on an application and a series capacitor connected to an output side of the amplifier and becoming a conductive state with respect to the electric current having the predetermined frequency but an open state with respect to the electric current having a frequency that is an odd multiple of the predetermined frequency. In the integrated circuit, the frequency that is the odd multiple thereof is processed by only the capacitor.

7 Claims, 4 Drawing Sheets

INTEGRATED CIRCUIT AMPLIFIER

BACKGROUND OF THE INVENTION

The present invention relates generally to an integrated circuit and more particularly to an integrated circuit incorporating an amplifying function.

In recent years, demands for mobile communications have increased, and with this increase, it has been highly requested that a portable telephone, etc. be downsized and reduced both in weight and in price. Satisfying those requests involves downsizing an integrated circuit employed in the portable telephone, etc. and working to amplify a high frequency and making the circuit operable at a high efficiency under a low voltage.

Attaining the downsizing entails adopting a monolithic microwave integrated circuit(MMIC) in which necessary circuits are integrated on a substrate.

Further, for pursuing a high-efficiency operation, a so-called F-class amplifier construction is taken. This F-class amplifier is reported on pp.121–146 of Nikkei Electronics, issued on Aug. 23, 1976. The F-class amplifier is constructed mainly of a transistor working as an electric current source and a load circuit having a specified high-frequency impedance, wherein specifically a load impedance opened with respect to an odd-numbered order higher harmonic (e.g. triple waves) exclusive of an operation frequency required depending on an application but short-circuited to the ground with respect to an even-numbered order higher harmonic (e.g. double-waves) is connected to an output side of the amplifying element.

According to the construction of this F-class amplifier, it is possible to transfer an unnecessary higher harmonic other than the necessary fundamental wave back to the amplifying element and attain the high efficiency by restraining a loss down to a minimum limit.

In the construction of the above F-class amplifier, for making the load impedance appear open to the triple-waves, as illustrated In FIG. 1, a parallel resonance circuit 8 consisting of an inductor 6 and a capacitor 5 is connected in series to the circuit. This circuit is a kind of a tuning circuit and has a function to increase the impedance. In such a parallel resonance circuit 8, an electric current having the operation frequency runs across mainly the inductor 6, and, as viewed from the amplifying element 3, there is substantially a conductive state. On the other hand, the capacitor 5 also acts on the triple-waves, and the parallel resonance circuit 8 approximates to an open state as viewed from the amplifying element 3.

Thus, in the conventional circuit, the loss by the triple-wave electric power is restrained, and the high efficiency is attained.

It was, however, practiced that the inductor 6 is thinned to satisfy the request for the downsizing, with the result that an increase in resistance value is induced. Further, the inductor is hard to be formed of a thick film due to a limit in terms of a process technology. Accordingly, the resistance value of the inductor can not be reduced enough, and the electric power of the fundamental wave dissipates, whereby the high-efficiency operation is hard to attain.

Moreover, the parallel resonance circuit 8 requires at least the two elements, i.e., the inductor 6 and the capacitor 5, and therefore, the increase in chip size is induced enough to make the downsizing and an improvement of a yield impossible. Besides, it is also difficult to reduce the price.

SUMMARY OF THE INVENTION

It is a primary object of the present invention to provide an integrated circuit capable of meeting demands for a higher efficiency end downsizing.

It is a secondary object of the present invention to provide an integrated circuit which can be produced in a reduced cost.

According to the present invention, there is provided an integrated circuit having an amplifier for amplifying input electric power having a predetermined frequency determined depending on an application, and a series capacitor connected to an output side of said amplifier and becoming a conductive state with respect to the electric current having the predetermined frequency but an open state with respect to the electric current having a frequency that is an odd multiple of the predetermined frequency.

Since an output side of an amplifier is provided with a series capacitor becoming conductive state with respect to an electric current having a predetermined frequency and an open state with respect to the electric current having a frequency that is an odd multiple of the predetermined frequency, and hence the frequencies of odd multiples can be processed with a small number of elements. It is therefore possible to attain the downsizing and reduce the price.

BRIEF DESCRIPTION OF THE DRAWINGS

In the accompanying drawings.

DESCRIPTION OF THE PREFERRED EMBODIMENTS

The present invention will hereinafter be discussed by way of embodiments with reference to the accompanying drawings.

Figure 2:
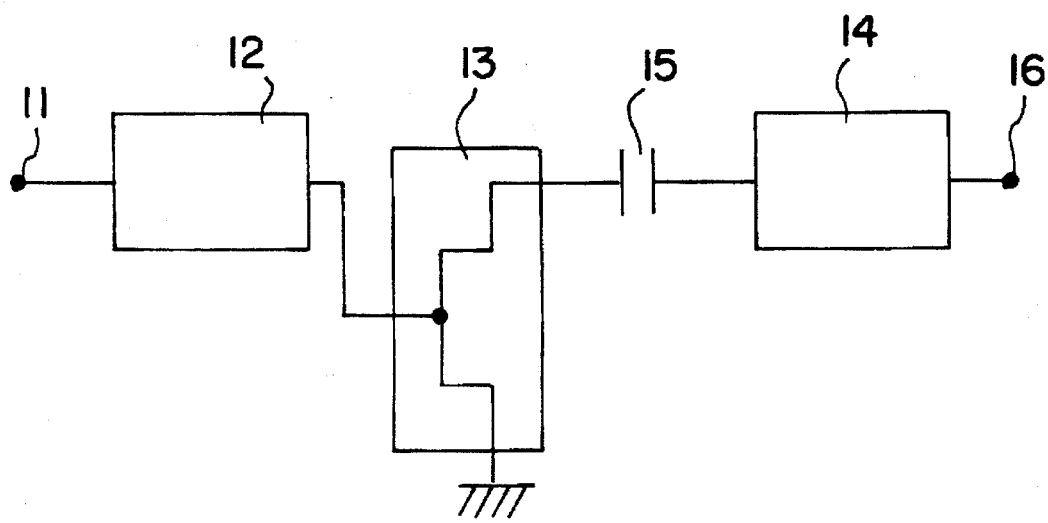
FIG. 2 is a block diagram illustrating an integrated circuit according to the present invention, for amplifying electric power in a 1.5 GHz frequency band.

FIG. 2 is a block diagram illustrating an integrated circuit for amplifying electric power in a 1.5 GHz frequency band. In this integrated circuit, the electric power from an input unit 11 passes through a signal line and is supplied via an input matching circuit 12 to an FET 13 serving as an amplifying element. Then, a capacitor 15 composed of a dielectric film is connected in series to an output side of the FET 13 and is further connected via an output matching circuit 14 to an output unit 16.

Figure 3:
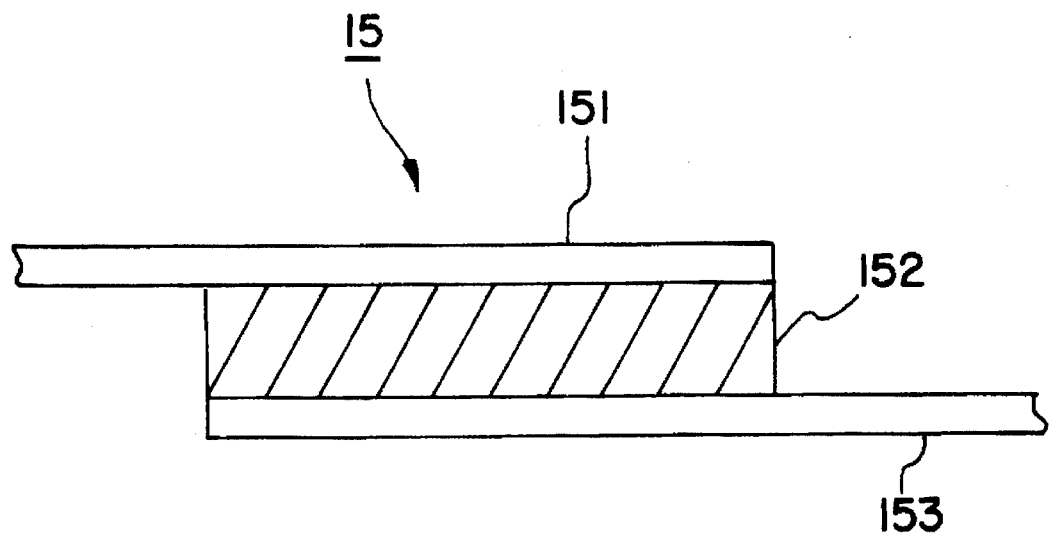
FIG. 3 is a sectional view showing one example of a capacitor having a desired characteristics.

FIG. 3 is a sectional view showing one example of the capacitor 15. This capacitor is an MIM capacitor in which a dielectric substance 152 is sandwiched in between an upper electrode 151 and a lower electrode 153. Herein, the electrode involves the use of desirably a noble metal, e.g., platinum that is hard to be oxidized, and an oxygen content thereof does not change for a long period.

Further, there is used the dielectric film composed of strontium barium titanate in this embodiment. The dielectric film is, e.g., 135 $\mu m^2$ in area and 200 nm in film thickness.

Figure 4:
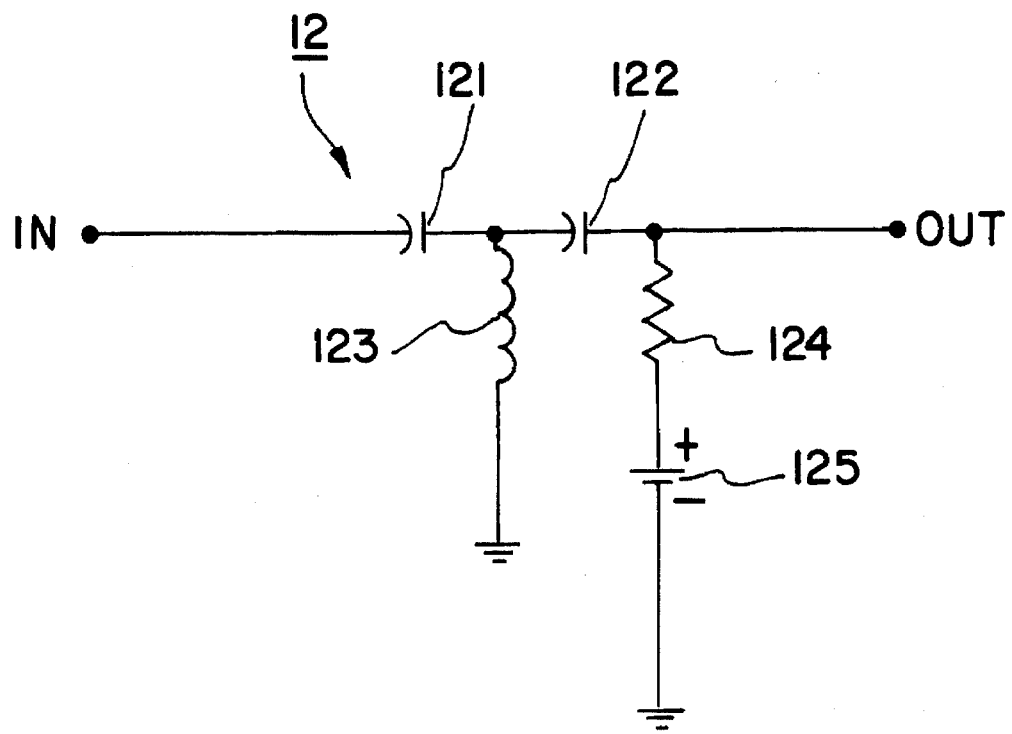
FIG. 4 shows one example of the input matching circuit.

FIG. 4 shows one example of the input matching circuit 12. This circuit is constructed such that two capacitors are connected in series between the input terminal and the output terminal, an inductance 123 is provided between a connecting mid-point thereof and the ground, and a resistor 124 and a power supply 125 are interposed in series between the ground and a connecting point between the capacitor 122 and the output terminal.

Figure 5:
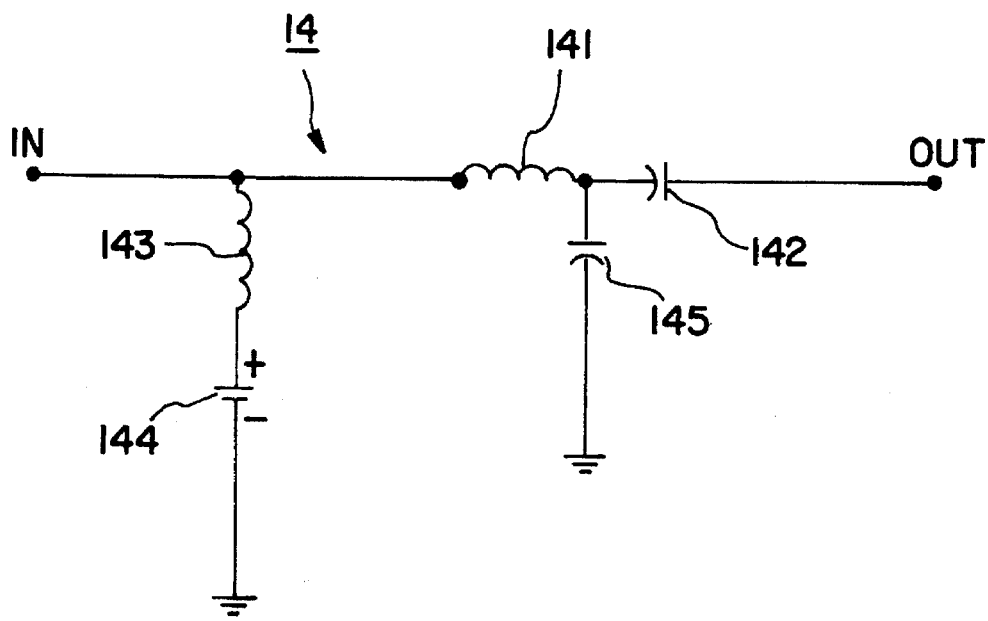
FIG. 5 illustrates one example of the output matching circuit shown in FIG. 4.

FIG. 5 illustrates one example of the output matching circuit 14. This circuit is constructed such that an inductance 141 and a capacitor 142 are connected in series between the input terminal and the output terminal, an inductance 143 and a power supply 144 are interposed between the ground and a connecting mid-point between the input terminal and the inductance, and a capacitor 145 is interposed between the ground the a connecting point between the inductance 141 and the capacitor 142.

Next, the operation of the circuit according to the present invention will be explained.

Generally, a dielectric constant of the dielectric substance largely changes at a boundary of a roll-off frequency intrinsic to the substance. That is, when the electric power having a frequency smaller than the roll-off frequency flows, the dielectric substance exhibits a dielectric constant as high as several hundreds, while the dielectric constant abruptly decreases in the vicinity of the roll-off frequency and, when over the role-off frequency, exhibits a value as low as one-several-tenth down to one-several-hundredth the roll-off frequency.

Figure 6:
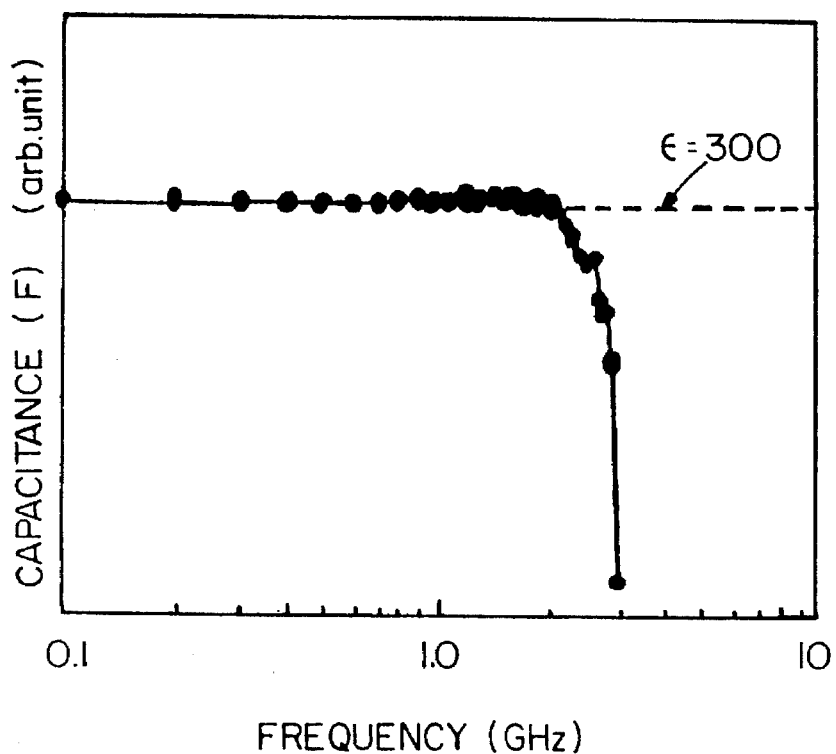
FIG. 6 shows a frequency characteristic of strontium barium titanate.

FIG. 6 shows a frequency characteristic of strontium barium titanate. The roll-off frequency of strontium barium titanate is approximately 2 GHz. Then, the dielectric constant of strontium barium titanate is about 300 when under the role-off frequency. The dielectric constant thereof, however, abruptly drops down at the frequency of 2 GHz and is 5 or thereabout at 3 GHz or greater.

Thus, with the change in the dielectric constant, a capacitance of the capacitor 15 also varies from approximately 1.8 pF under the frequency of 2 GHz to approximately 0.03 pF at a frequency of 3 GHz. In the case of applying those characteristics to the embodiment of FIG. 2, an impedance on the output side as viewed from the FET 13 becomes about −j59 ohms at a frequency of 1.5 GHz, and there appears substantially the conductive state. In contrast with this, the open state may appear on condition that an absolute value of the impedance is 1000 ohms or larger. At a frequency of 4.5 GHz, the impedance is about −j1200 ohms, and the open state appears as viewed from the FET 13.

Hence, according to the present invention, the impedance characteristics corresponding to such variations in the frequency can be obtained by use of only the capacitor, whereby no loss in the circuit due to the increase in the resistance of the inductor 6 can be seen unlike the prior art. In accordance with this embodiment, the efficiency as high as 75–80% could be obtained at the operation frequency.

Figure 1:
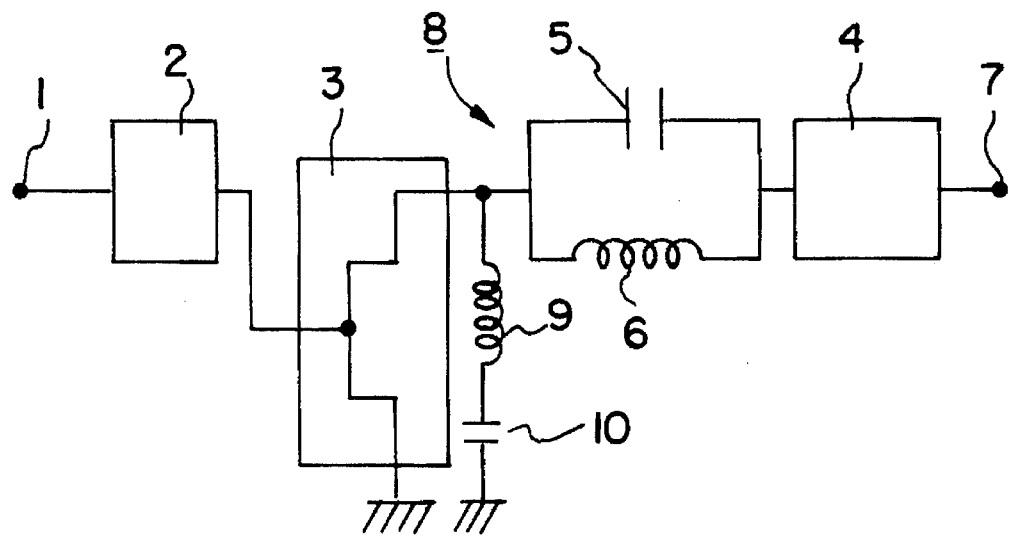
FIG. 1 is a block diagram illustrating a conventional integrated circuit including a parallel resonance circuit.

This characteristic is measured and tried to compared with the prior art circuit explained referring to FIG. 1 by way of a comparative example. The parallel resonance circuit 8 in the conventional frequency of 4.5 GHz derided as triple waves of the operation frequency, and the circuit loss is made to decrease by leading it to the open state as viewed from the FET. However, the resonance circuit includes the inductor, and therefore it happens that the efficiency decreases due to the resistance of the inductor. In the comparative example, the efficiency measured at the operation frequency of 1.5 GHz is not more than 65–70%.

Figure 7:
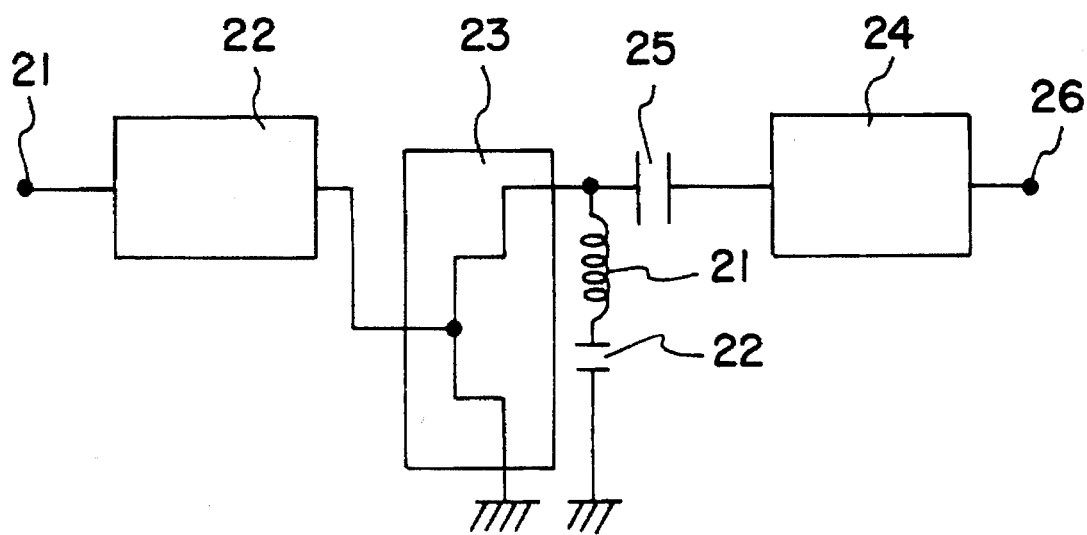
FIG. 7 illustrates an embodiment in which a circuit for processing the double-waves of the operation frequency is added to the circuit of FIG. 2.

FIG. 7 illustrates an embodiment in which a circuit for processing the double-waves of the operation frequency is added to the circuit of FIG. 2.

In this embodiment, as in the same way with the embodiment illustrated in FIG. 2, a capacitor 25 is provided on an output side of an FET 23. On the output side of the FET 23, however, a series circuit constructed of an inductor 21 and a capacitor 22 is further grounded.

In the embodiments discussed above, the operation frequency is set at 1.5 GHz but is not limited to this. Normally used operation frequencies such as 800 MHz, 1.9 HZ, 21 GHz may also be usable. In this case, it is required that the dielectric substance having the roll-off frequency above the operation frequency but under three times as large as the operation frequency be selected as a dielectric substance of the capacitor. Usable material for satisfying such conditions may be strontium titanate and FZT ($PbZr_xTi_{1-x}O_3$) other than strontium barium titanate.

What is claimed is:

1. An integrated circuit comprising:

an amplifier for amplifying input electric power having a predetermined frequency determined depending on an application, and a series capacitor connected to an output side of said amplifier and becoming a conductive state with respect to the electric current having the predetermined frequency but an open state with respect to the electric current having a frequency that is an odd multiple of the predetermined frequency.

2. The integrated circuit according to claim 1, wherein said capacitor is a dielectric film having a roll off frequency between the predetermined frequency and a frequency that is at least three times the predetermined frequency.

3. The integrated circuit according to claim 2, wherein said dielectric film is composed of strontium titanate or strontium barium titanate.

4. The integrated circuit according to claim 1, wherein an absolute value of an impedance of said capacitor as viewed from the output side of said amplifier is 1000 ohms or larger at the frequency that is three times the predetermined frequency.

5. The integrated circuit according to claim 3, wherein said capacitor is constructed in such a form that said dielectric film is sandwiched in between metal electrodes.

6. The integrated circuit according to claim 5, wherein said metal electrodes are noble metal electrodes.

7. The integrated circuit according to claim 1, wherein the circuit further comprises a double-wave processing circuit connected to the output side of said amplifier.

* * * * *